US010420203B2

(12) United States Patent
Kokas et al.

(10) Patent No.: US 10,420,203 B2
(45) Date of Patent: Sep. 17, 2019

(54) HEAT PIPE EMBEDDED HEAT SINK WITH INTEGRATED POSTS

(71) Applicant: Hamilton Sundstrand Corporation, Charlotte, NC (US)

(72) Inventors: Jay W. Kokas, East Granby, CT (US); Kenneth J. Trotman, Granby, CT (US); Kerry R. Querns, Durham, CT (US); Rachel Farner, Springfield, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 1276 days.

(21) Appl. No.: 13/932,671

(22) Filed: Jul. 1, 2013

(65) Prior Publication Data

US 2017/0042017 A1    Feb. 9, 2017

(51) Int. Cl.
| | | |
|---|---|---|
| *H05K 1/02* | (2006.01) | |
| *H05K 7/20* | (2006.01) | |
| *H01L 23/40* | (2006.01) | |
| *H01L 23/427* | (2006.01) | |
| *H01L 23/367* | (2006.01) | |
| *F28D 15/02* | (2006.01) | |

(52) U.S. Cl.
CPC ....... *H05K 1/0203* (2013.01); *F28D 15/0233* (2013.01); *H01L 23/367* (2013.01); *H01L 23/4006* (2013.01); *H01L 23/427* (2013.01); *H05K 1/0209* (2013.01); *H01L 2924/0002* (2013.01); *H05K 7/20336* (2013.01); *H05K 7/20881* (2013.01); *H05K 2201/064* (2013.01); *H05K 2201/066* (2013.01)

(58) Field of Classification Search
CPC ............ H05K 7/2029; H05K 7/20336; H05K 7/20881; H05K 7/20936; H05K 1/0203–1/0204; H05K 2201/064; H05K 2201/066
USPC ....... 361/700, 720, 758, 742; 165/80.4–80.5, 165/104.33; 257/712, E23.088; 174/15.2
See application file for complete search history.

(56) References Cited

U.S. PATENT DOCUMENTS

| | | | |
|---|---|---|---|
| 6,802,362 B2 | 10/2004 | Wenger et al. | |
| 6,883,594 B2 | 4/2005 | Sarraf et al. | |
| 7,164,587 B1 | 1/2007 | Garnett et al. | |
| 7,304,846 B2 * | 12/2007 | Wang ................ | H05K 7/20445 165/104.21 |
| 7,342,788 B2 | 3/2008 | Nikfar | |
| 7,405,937 B1 | 7/2008 | Wang et al. | |

(Continued)

OTHER PUBLICATIONS

Great Britain Search and Examination Report for Great Britain Patent Application No. 1407700.2, dated Oct. 1, 2014, 6 pages.

*Primary Examiner* — Zachary Pape
(74) *Attorney, Agent, or Firm* — Kinney & Lange, P.A.

(57) ABSTRACT

An apparatus includes a heat sink and a post that supports the heat sink that is monolithically formed with the heat sink. The apparatus can further include a printed wiring board attached to a top side of the heat sink with electronic components attached to the printed wiring board, a plurality of posts integrated into a bottom side of the heat sink and extending outwards from the heat sink, wherein the heat sink and the plurality of posts are monolithically formed, and a heat pipe attached to the bottom side of the heat sink with a first end near an electronic component and a second end near one of the plurality of posts.

18 Claims, 2 Drawing Sheets

(56) References Cited

U.S. PATENT DOCUMENTS

| | | | |
|---|---|---|---|
| 7,493,939 B2 | 2/2009 | Xia et al. | |
| 7,583,504 B2 * | 9/2009 | Aberg | H01L 23/4006 165/80.3 |
| 7,885,075 B2 | 2/2011 | Li et al. | |
| 7,924,565 B2 | 4/2011 | Huang et al. | |
| 8,004,842 B2 | 8/2011 | Huang et al. | |
| 8,197,099 B2 * | 6/2012 | Oyaizu | H01L 23/4006 361/719 |
| 2004/0112570 A1 | 6/2004 | Wenger et al. | |
| 2005/0224217 A1 | 10/2005 | Whitney | |
| 2008/0142193 A1 * | 6/2008 | Li | B21D 53/08 165/80.3 |
| 2008/0158820 A1 | 7/2008 | Peng et al. | |
| 2010/0128442 A1 | 5/2010 | Wu et al. | |
| 2011/0292614 A1 * | 12/2011 | Horng | H01L 23/3677 361/720 |
| 2012/0085520 A1 * | 4/2012 | Pfaffinger | H01L 23/427 165/104.26 |
| 2014/0022733 A1 * | 1/2014 | Lim | H05K 7/2039 361/718 |
| 2014/0182817 A1 * | 7/2014 | Yu | G06F 1/20 165/104.21 |
| 2014/0254104 A1 * | 9/2014 | Chen | H05K 1/0209 361/720 |

* cited by examiner ns. The present application discloses multiple arrangements where heat can be transferred from a high heat generating electronic component on a printed wiring board through a heat pipe to a post that supports the printed wiring board. The post can then dispel the heat into an ambient, thus cooling the overall electronic assembly.

HEAT PIPE EMBEDDED HEAT SINK WITH INTEGRATED POSTS

STATEMENT OF GOVERNMENT INTEREST

The U.S. Government has a paid-up license in this invention and the right in limited circumstances to require the patent owner to license others on reasonable terms as provided for by the terms of Contract No. FA8650-09-C-2906 awarded by the United States Air Force.

BACKGROUND

The present invention relates to a cooling apparatus for printed wiring boards.

Thermal management of aircraft mounted electronic components is becoming increasingly more challenging with the higher density of more powerful, but smaller electronic components. Currently, heat pipe embedded heat sinks have been used to move heat from a hot electronic component on a printed wiring board to cooler locations. Heat pipe embedded heat sinks have an inherent loss of efficiency in that the heat has to move from the electronic component, through the printed wiring board, to the heat sink, and then to a cooler location.

Due to space limitations on aircraft, printed wiring boards are typically stacked on top of one other and separated with posts. These posts are separate pieces that are attached to a printed wiring board and/or heat sink with screws. The posts support the printed wiring boards and create space between the printed wiring boards so that air can flow around the printed wiring boards. The posts can also be used to suspend a printed wiring board in a chassis that is mounted on an aircraft.

SUMMARY

An apparatus includes a heat sink and a post that supports the heat sink that is monolithically formed with the heat sink.

An apparatus for cooling electronic components on a printed wiring board includes a heat sink with a top side and a bottom side, a printed wiring board attached to the top side of the heat sink with electronic components attached to the printed wiring board, a plurality of posts integrated into the bottom side of the heat sink and extending outwards from the heat sink, wherein the heat sink and the plurality of posts are monolithically formed, and a heat pipe attached to the bottom side of the heat sink with a first end near an electronic component and a second end near one of the plurality of posts.

A method for cooling an electronic component on a printed wiring board includes absorbing heat into a first end of a heat pipe on a heat sink from an electronic component on a printed wiring board, transferring the heat through the heat pipe, and releasing the heat at a second end of the heat pipe into a post that is monolithically formed with the heat sink.

DETAILED DESCRIPTION

In general, the present invention relates to transferring heat from an electronic component to a post using a heat pipe. With advancements in technology, more powerful electronic components are being used in aircraft applications. These electronic components tend to be higher heat generating electronic components, so more effective heat dissipating arrangements are needed to cool these components. The present application discloses multiple arrangements where heat can be transferred from a high heat generating electronic component on a printed wiring board through a heat pipe to a post that supports the printed wiring board. The post can then dispel the heat into an ambient, thus cooling the overall electronic assembly.

Figure 1:
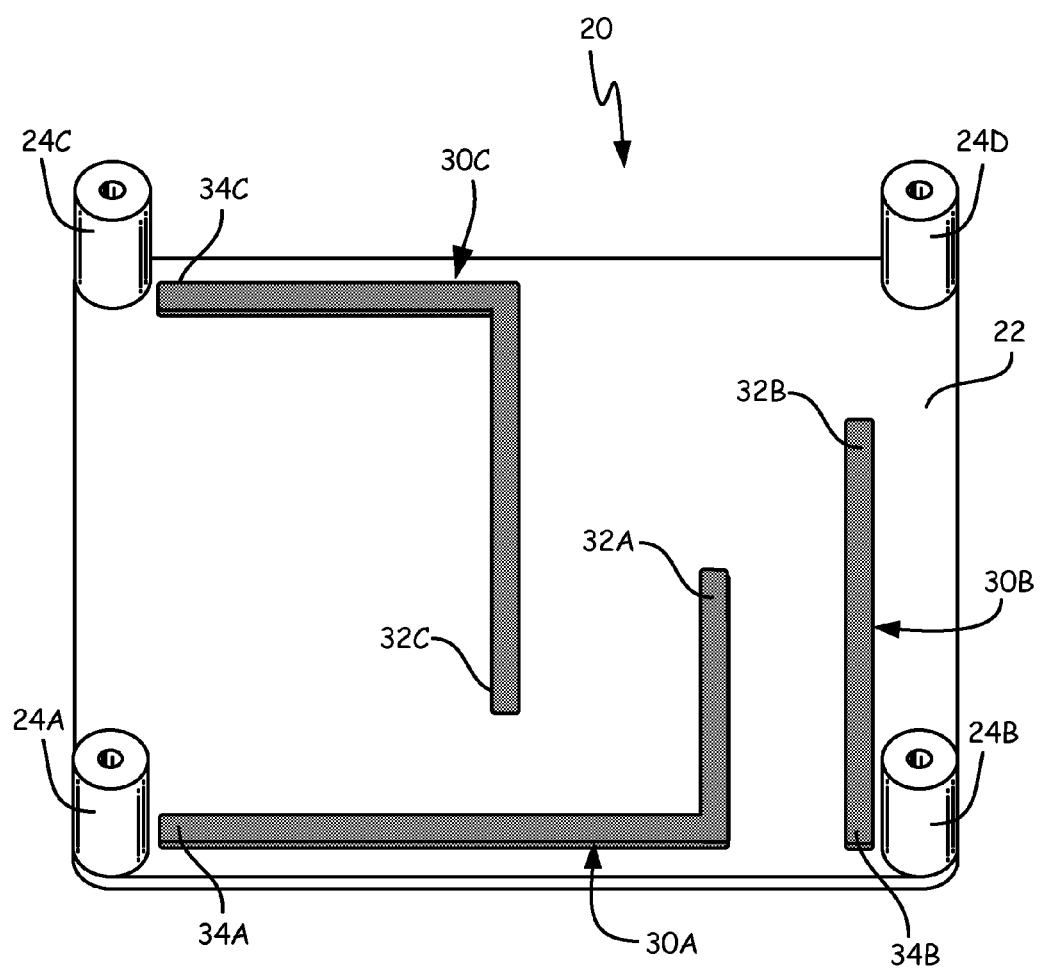
FIG. 1 is a bottom plan view of a monolithically formed heat sink with posts.

FIG. 1 is a bottom plan view of monolithically formed heat sink 20, which includes base plate 22, posts 24 (including post 24A, post 24B, post 24C, and post 24D), and heat pipes 30 (including heat pipe 30A, heat pipe 30B, and heat pipe 30C). Each heat pipe 30 includes first end 32 and second end 34. Heat pipe 30A includes first end 32A and second end 34A. Heat pipe 30B includes first end 32B and second end 34B. Heat pipe 30C includes first end 32C and second end 34C.

Heat sink 20 can be placed underneath a printed wiring board to transfer heat from high heat generating electronic components to posts 24. Heat sink 20 can be any size or shape that is capable of being positioned underneath a printed wiring board. Heat sink 20 can be made out of aluminum or any other suitable material. Heat sink 20 includes base plate 22 and posts 24. Base plate 22 and posts 24 are monolithically formed to create heat sink 20, and can be manufacturing by casting, machining, or any other suitable manufacturing process that is capable of forming heat sink 20 monolithically.

Posts 24 are positioned on base plate 22 to support heat sink 20 and a printed wiring board when heat sink 20 is positioned underneath a printed wiring board. In FIG. 1, there are four posts 24 and each post 24 is positioned at a corner of base plate 22. Post 24A is positioned at a first corner of base plate 22, post 24B is positioned at a second corner of base plate 22, post 24C is positioned at a third corner of base plate 22, and post 24D is positioned at a fourth corner of base plate 22. In alternate embodiments, heat sink 20 can include any number of posts 24 and the posts 24 can be positioned at any location on base plate 22. Further, posts 24 can be constructed with any size, shape, and length depending on where heat sink 20 will be used.

Heat pipes 30 are also positioned on base plate 22 of heat sink 20. Heat pipes 30 are located on heat sink 20 to effectively transfer heat from high heat generating electronic components to posts 24 so that the heat can be dissipated into an ambient from post 24. Each heat pipe 30 includes first end 32 that is positioned on base plate 22 so that it is located near a high heat generating electronic component. Each heat pipe 30 also includes second end 34 that is positioned on base plate 22 so that it is located near one post 24. Heat pipe 30A is positioned with first end 32A near a center of base plate 22 and with second end 34A near post 24A. Heat pipe 30B is positioned with first end 32B near an edge of base plate 22 and second end 34B near post 24B. Heat pipe 30C is positioned with first end 32C near a center of base plate 22 and with second end 34C near post 24C. Heat pipes 30 are soldered onto heat sink 20 in the embodiment shown, but can be attached to heat sink 20 with any suitable means in alternate embodiments, including bonding, welding, or pressing. In the embodiment seen in FIG. 1, there are three heat pipes 30 positioned on heat sink 20. In alternate embodiments, heat sink 20 can include any number of heat pipes 30 and heat pipes 30 can be arranged in any manner.

Heat pipes 30 each include a hollow housing. The housing can contain a working fluid that is capable of two-phase heat transfer and a wick material on interior surfaces of the housing to wick the working fluid from second ends 34 of heat pipes 30 to first ends 32 of heat pipes 30. Heat from high heat generating electronic components will enter heat pipes 30 at first end 32, causing the working fluid to vaporize. The vaporized working fluid can then be transferred through heat pipe 30. The vaporized working fluid can release the heat into post 24 at second end 34, causing the working fluid to condense. The wick material can then transfer the condensed working fluid back to first end 32. Heat pipes 30 can be constructed out of any suitable materials, including any suitable housing material, any suitable working fluid, and any suitable wick material. Heat pipes 30 can be shaped and sized to fit in any arrangement on heat sink 20.

Transferring heat from high heat generating electronic components on a printed wiring board to posts 24 is advantageous, as it allows for more efficient heat transfer. Heat can be dissipated through posts 24 and into an ambient, thus posts 24 provide a thermal path through which heat can be dispelled. It is advantageous to dispel heat through posts 24, as it more effectively cools the printed wiring board that heat sink 20 is positioned under. With more effective cooling, more powerful and higher heat generating electronic components can be used in aircraft applications. This provides more flexibility during design and allows for more efficient and effective electronic components to be used in aircraft applications.

Forming heat sink 20 so that base plate 22 and posts 24 are monolithic is also advantageous, as it reduces thermal energy loss as heat from high heat generating electronic components is transferred through heat sink 20 and posts 24 into an ambient. In prior art applications, posts 24 are separate pieces that are attached to base plate 22 of heat sink 24 with a fastener. In this arrangement, there is an inherent thermal resistance between posts 24 and base plate 22. There is also potentially a small gap between posts 24 and base plate 22, which adds to the thermal resistance between the two. Forming base plate 22 and posts 24 monolithically eliminates the potential of having a small gap between posts 24 and base plate 22, therefore reducing the thermal resistance between the two.

Further, forming base plate 22 and posts 24 of heat sink 20 monolithically saves time and money. Currently, posts 24 need to be procured, stored, and then assembled. Forming heat sink 20 monolithically eliminates the need to procure and store posts 24, which saves time and money as posts 24 do not need to be purchased separately from heat sink 20. This also saves on inventory costs associated with storing posts 24. Further, time and cost are saved during assembly, as posts 24 do not need to be separately connected to heat sink 20. Forming heat sink 20 monolithically saves time and money during assembly of heat sink 20.

Figure 2:
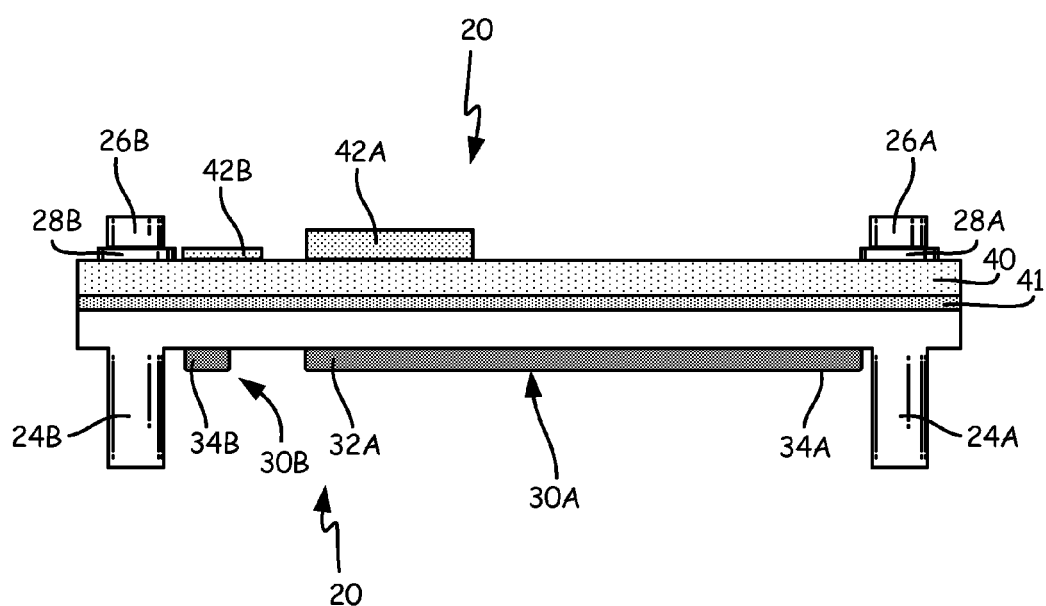
FIG. 2 is a side elevation view of the monolithically formed heat sink with posts when it is positioned underneath a printed wiring board.

FIG. 2 is a side elevation view of monolithically formed heat sink 20 with posts 24 when heat sink 20 is placed underneath printed wiring board 40. Heat sink 20 includes base plate 22, posts 24 (including post 24A and post 24B), and heat pipes 30 (including heat pipe 30A and heat pipe 30B). Heat pipe 30A includes first end 32A and second end 34A. Heat pipe 30B includes first end 32A (not shown) and second end 34B. Also included is printed wiring board 40, sheet film adhesive 41, and electronic components 42 (including electronic component 42A and electronic component 42B). Printed wiring board 40 is connected to heat sink 20 with sheet film adhesive layer 41, creating a printed wiring board/heat sink module. The printed wiring board/heat sink module can then be attached to other modules or to a chassis using posts 24, fasteners 26 (including fastener 26A and fastener 26B), and washers 28 (including washer 28A and washer 28B).

Electronic components 42 are positioned on a top side of printed wiring board 40, and heat sink 20 is positioned on a bottom side of printed wiring board 40. Heat from electronic components 42 transfers through printed wiring board 40 to heat sink 20 in the embodiment shown. Heat sink 20 is attached to printed wiring board 40 with sheet film adhesive 41 to create a printed wiring board/heat sink module. Posts 24 can be used to attach the printed wiring board/heat sink module to other modules or a chassis using fasteners 26 running through posts 24. Washers 28 are placed between fasteners 26 and printed wiring board 40. Fastener 26A runs through post 24A of heat sink 20 with washer 28A placed between fastener 26A and printed wiring board 40. Fastener 26B runs through post 24B of heat sink 20 with washer 28B placed between fastener 26B and printed wiring board 40. In the embodiment shown, fasteners 26 are screws, but in alternate embodiments fasteners 26 can be any fastener that is capable of attaching printed wiring board 40 to heat sink 20.

Heat sink 20 includes base plate 22 and posts 24 that are monolithically formed. Posts 24 are positioned on base plate 22 to support heat sink 20. Heat pipes 30 are positioned on heat sink 20 with first ends 32 near high heat generating electronic components and second ends 34 near posts 24. In the embodiment shown in FIG. 2, heat sink 20 includes both heat pipe 30A and heat pipe 30B. In alternate embodiments, heat sink 20 can include any number of heat pipes 30, and heat pipes 30 can be positioned on heat sink 20 in any manner.

In the embodiment shown, heat pipe 30A has first end 32A that is positioned on heat sink 20 so that it is located underneath electronic component 42A. Heat pipe 30A also has second end 34A that is positioned on heat sink 20 so that it is located near post 24A. With this arrangement, heat can dissipate from electronic component 42A through printed wiring board 40 and heat sink 20 so that it can be absorbed by first end 32A of heat pipe 30A. The heat can then transfer through heat pipe 30A to second end 34A. The heat can then be released from second end 34A and transfer into post 24A to dissipate through post 24A and into an ambient.

Heat pipe 30B has first end 32B (not shown) that is positioned on heat sink 20 so that it is located underneath electronic component 42B. Heat pipe 30B also has second end 34B that is positioned on heat sink 20 so that it is located near post 24B. With this arrangement, heat can dissipate from electronic component 42B through printed wiring board 40 and heat sink 20 so that it can be absorbed by first end 32B of heat pipe 30B. The heat can then transfer through heat pipe 30B to second end 34B. The heat can then be released from second end 34B and transfer into post 24B to dissipate through post 24B and into an ambient.

It is advantageous to dissipate heat from heat sink 20 through heat pipes 30 to posts 24, as posts 24 provide a thermal pathway to dispel heat from heat sink 20 into an ambient. Dispelling heat through posts 24 is advantageous, as it allows for more efficient cooling. Having enhanced cooling abilities allows higher heat generating but more powerful electronic components 42 to be used. These electronic components 42 tend to be smaller than previously used electronic components, thus saving weight in aircraft applications. Reducing the weight of an aircraft allows the aircraft to function more efficiently.

Further, forming heat sink 20 monolithically is advantageous, as it reduces thermal resistance as heat from electronic components 42 is dissipated through heat sink 20 to posts 24. The heat can more effectively transfer from second ends 34 of heat pipes 30 to posts 24 when there is no gap between base plate 22 and posts 24, as there was in previous models. Forming heat sink 20 monolithically also reduces the time and cost it takes to procure, store, and assemble posts 24 with heat sink 20, as it eliminates the need to procure, store, and assemble these additional parts.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An apparatus comprising:
    a heat sink with a top side and a bottom side, wherein the top side of the heat sink is configured to be attached to a printed wiring board;
    a post that supports the heat sink is monolithically formed with the heat sink, and extends out from the bottom side of the heat sink;
    a fastener extending through the heat sink and into the post, wherein the fastener is configured to extend through the printed wiring board to attach the printed wiring board to the heat sink; and
    a heat pipe attached to the bottom side of the heat sink, wherein a first end of the heat pipe is positioned to absorb heat from the printed wiring board through the heat sink and a second end of the heat pipe is positioned to dissipate heat through the post and away from the printed wiring board.

2. The apparatus of claim 1, wherein the heat sink and the post are made out of aluminum.

3. The apparatus of claim 1, wherein the heat sink and the post are manufactured by machining or casting.

4. The apparatus of claim 1, and further comprising:
    a plurality of posts positioned to support the heat sink, wherein each of the plurality of posts are monolithically formed with the heat sink.

5. The apparatus of claim 4, and further comprising:
    a plurality of heat pipes attached to the bottom side of the heat sink.

6. The apparatus of claim 1, wherein the heat pipe is soldered, bonded, or pressed into the bottom side of the heat sink.

7. The apparatus of claim 5, wherein a printed wiring board is attached to the top side of the heat sink and the heat sink absorbs heat from the printed wiring board.

8. The apparatus of claim 5, wherein first ends of the plurality of heat pipes are positioned to absorb heat from the printed wiring board through the heat sink and second ends of the plurality of heat pipes are positioned to dissipate heat through the plurality of posts.

9. An apparatus for cooling electronic components on a printed wiring board comprising:
    a heat sink with a top side and a bottom side;
    a printed wiring board with a top side and a bottom side, wherein the bottom side of the printed wiring board is attached to the top side of the heat sink, and wherein electronic components are attached to the top side of the printed wiring board;
    a plurality of posts integrated into the bottom side of the heat sink and extending outwards from the bottom side of the heat sink, wherein the heat sink and the plurality of posts are monolithically formed;
    a plurality of fasteners, wherein each fastener extends through the printed wiring board and the heat sink and into one of the plurality of posts; and
    a heat pipe attached to the bottom side of the heat sink with a first end near an electronic component to absorb heat from the electronic component through the printed wiring board and the heat sink and a second end near one of the plurality of posts to dissipate heat through the one of the plurality of posts and away from the printed wiring board.

10. The apparatus of claim 9, wherein the heat sink and the plurality of posts are made out of aluminum.

11. The apparatus of claim 9, wherein forming the heat sink and the plurality of posts monolithically prevents a gap from forming between the heat sink and the plurality of posts.

12. The apparatus of claim 9, wherein the heat is transferred from the first end of the heat pipe to the second end of the heat pipe with phase-change heat transfer.

13. The apparatus of claim 12, wherein the heat is released from the second end of the heat pipe into one of the plurality of posts.

14. The apparatus of claim 13, wherein heat can be dissipated through each of the plurality of posts and into an ambient.

15. A method for cooling an electronic component on a printed wiring board comprising:
    absorbing heat into a first end of a heat pipe on a heat sink from the electronic component on the printed wiring board, wherein heat is transferred from the electronic component through the printed wiring board and through the heat sink to the first end of the heat pipe, and wherein the electronic component is attached to a top side of the printed wiring board, a bottom side of the printed wiring board is attached to a top side of the heat sink, and the heat pipe is attached to a bottom side of the heat sink;
    transferring the heat through the heat pipe; and
    releasing the heat at a second end of the heat pipe into a post that is monolithically formed with the heat sink to dissipate heat away from the printed wiring board, wherein the post extends out from the bottom side of the heat sink, and wherein a fastener extends through the printed wiring board and the heat sink and into the post to attach the printed wiring board to the heat sink.

16. The method of claim 15, wherein the heat pipe transfers heat with phase-change heat transfer.

17. The method of claim 16, wherein the heat pipe contains a working fluid and a wick structure layer to facilitate phase-change heat transfer.

18. The method of claim 15, and further comprising:
    transferring heat from the second end of the heat pipe through the post and into an ambient.

\* \* \* \* \*